United States Patent
Lucignano et al.

(10) Patent No.: US 10,045,469 B2
(45) Date of Patent: Aug. 7, 2018

(54) MAGNETIC FIELD PROTECTING AND SCREENING MULTI-LAYER TEXTILE CONSTRUCTION

(71) Applicant: SAATI S.P.A., Appiano Gentile (CO) (IT)

(72) Inventors: Carmine Lucignano, Appiano Gentile (IT); Marco Mietta, Appiano Gentile (IT); Paolo Canonico, Appiano Gentile (IT)

(73) Assignee: SAATI S.P.A., Appiano Gentile (CO) (IT)

( * ) Notice: Subject to any disclaimer, the term of this patent is extended or adjusted under 35 U.S.C. 154(b) by 0 days.

(21) Appl. No.: 14/914,967

(22) PCT Filed: Jul. 29, 2014

(86) PCT No.: PCT/IB2014/063499
§ 371 (c)(1),
(2) Date: Feb. 26, 2016

(87) PCT Pub. No.: WO2015/028907
PCT Pub. Date: Mar. 5, 2015

(65) Prior Publication Data
US 2016/0278249 A1    Sep. 22, 2016

(30) Foreign Application Priority Data

Aug. 26, 2013 (IT) .............................. MI2013A1408

(51) Int. Cl.
*H04R 1/02* (2006.01)
*H05K 9/00* (2006.01)
(Continued)

(52) U.S. Cl.
CPC ............. *H05K 9/009* (2013.01); *H04R 1/023* (2013.01); *H04R 1/086* (2013.01); *H04M 1/03* (2013.01); *H04R 2499/11* (2013.01)

(58) Field of Classification Search
CPC .... H04R 1/023; H04R 1/086; H04R 2499/11; H05K 9/009; H04M 1/03
See application file for complete search history.

(56) References Cited

U.S. PATENT DOCUMENTS 4,593,736 A * 6/1986 Morita ................. A45C 11/182
150/131
4,785,136 A * 11/1988 Mollet ................... G06F 1/182
174/363

(Continued)

FOREIGN PATENT DOCUMENTS

EP    0609223 B1    5/1996
WO   93/08674 A1    4/1993

OTHER PUBLICATIONS

International Search Report in corresponding application dated Nov. 28, 2014.

*Primary Examiner* — Matthew Eason
*Assistant Examiner* — Taunya McCarty
(74) *Attorney, Agent, or Firm* — Hedman & Costigan, P.C.; James V. Costigan; Kathleen A. Costigan

(57) ABSTRACT

A laminated double-layer textile product comprises a square mesh ferromagnetic alloy metal filament or thread technical fabric layer coupled to a square mesh synthetic monofilament technical fabric layer by laminating to provide a diffused joining of said two layers, said laminating comprising a hot-melt laminating.

12 Claims, 3 Drawing Sheets

(51) Int. Cl.
*H04R 1/08* (2006.01)
*H04M 1/03* (2006.01)

(56) References Cited

U.S. PATENT DOCUMENTS

| | | | | |
|---|---|---|---|---|
| 5,365,840 | A * | 11/1994 | Newman | B41C 1/14 |
| | | | | 101/127 |
| 6,991,673 | B2 * | 1/2006 | Wastijn | B01D 46/0078 |
| | | | | 210/493.2 |
| 7,434,659 | B2 * | 10/2008 | Ayle | F02C 7/045 |
| | | | | 181/284 |
| 2009/0245565 | A1 * | 10/2009 | Mittleman | H04M 1/035 |
| | | | | 381/365 |
| 2010/0006221 | A1 * | 1/2010 | Janke | C08G 18/12 |
| | | | | 156/322 |
| 2010/0304796 | A1 | 12/2010 | Stohr | |
| 2012/0270025 | A1 * | 10/2012 | Russell | B32B 5/06 |
| | | | | 428/219 |
| 2013/0032285 | A1 | 2/2013 | Mietta | |

* cited by examiner

MAGNETIC FIELD PROTECTING AND SCREENING MULTI-LAYER TEXTILE CONSTRUCTION

BACKGROUND OF THE INVENTION

The present invention relates to a magnetic field protecting and screening multi-layer textile construction.

The present invention may be generally applied to all electronic devices, either of a small or large series, including at least an audio function, that is a (voice or music) sound emission from loudspeakers or the like devices, or a sound reception by many types of microphones, which general application field comprises a number of device families and sub-families such as:

Telephonic field:
Cellular phones
Land-based telephonic articles (phones, hand-free phones and related fittings) and Skype/SAT phones.
Communications:
Walkie-talkies
Helmet and protective caps built-in audio devices
Professional radio apparatus for military, safety, civil protection and outdoor works.
Entertainment:
Hand-held Hi-Fi devices (MP3 players, earphones, headphones and hand-held acoustic boxes)
Professional audio fittings (microphones, headphones, loudspeaker components)
TVs (LCD displays, monitors, hand-held DVD players).
Transports:
Satellite navigator systems including voice directions
Automotive (Car Hi-Fi, hands-free warning and voice equipments)
On board communications devices (trains/airplanes/ships).
Other applications:
Computers (monitor speakers, external acoustical boxes, auxiliary microphones, webcams)
Domestic application fittings (intercommunication or interphone systems, in-home audio communications)
Acoustical devices for ear impaired persons and other medical devices.

In many hand-held systems, because of designing and size miniaturizing reasons, loudspeakers and microphones are frequently arranged, as it is well known, near antennas or SIM cards.

In this case, if the stationary or low frequency magnetic field generated by the above acoustic components exceeds a given or target threshold value, then it may cause a demagnetization of the SIM card or other electromagnetic interferences with antennas, which cannot properly operate.

Moreover, the acoustic component generated magnetic field draws or attracts contaminating metal parts from the environment causing them to pass through component protecting screening or shielding units, thereby the overall equipment cannot properly operate because of a mechanical interference phenomenon.

Thus, in the above systems, it is necessary to reduce the acoustic component generated magnetic field strength, and improve said component protecting assemblies while reducing other electromagnetic interferences with other electronic components nearby.

Thus, the aim of the invention is just to solve the above problems affecting internal acoustic components, such as loudspeakers and microphones, which are very delicate components which must be further protected against intrusion of water and solid particles (powder, dust, dangerous fragments) by a protecting system which does not negatively affect the target emission and reception sound features.

The above, in turn, results in very complex functional requirements of the acoustic component, since it is necessary to combine good sound transmission characteristics, to be achieved by openings formed through outer shell assemblies, with a satisfactory component protection (which, in turn, requires to insulate as far as possible the acoustic components from the outer environment) with a proper magnetic field screening (which, per se, requires to insulate as far as possible from the outer environment the acoustical component).

In standard conditions, conventional methods for achieving the above aim and objects comprise applying porous protective devices on outer openings and, if a target protection level or a full magnetic field screening is required, said outer openings will have a very complex design.

In a typical cellular phone, as shown by the reference number 1 in FIG. 1, said outer openings comprise three openings at the main loudspeaker 2, the microphone 3 and the hands-free/ringing loudspeaker 4.

To properly protect acoustical components, many protective devices are at present used, depending on design requirements, the protective type and degree, and on whether or not a full screening from the magnetic field is required.

Hereinbelow is shown a list of main possible approaches, properly arranged in an increasing protection level order.

2.1. No protection. The acoustical component is exposed to the outer environment (this being an uncommon solution).

2.2. Molded plastic material protecting bars or grids, with an anti-impact function only.

2.3. Large mesh opening protective nets, either made of a metal material (for example in spherically protecting microphones) or a molded plastics material, and operating as anti-intrusion elements for small articles (such as pencils and the like).

2.4. A non-woven material screen or shield, with an optional water-repellent or hydrophobic treatment, arranged on the acoustical component front portion.

2.5. A synthetic single-thread or monofilament technical fabric material, with an optional water-repellent treatment.

2.6. A water-repellent membrane, made of an E-PTFE (expanded PTFE) material.

If, in addition to providing protection against polluting particles and liquids, the acoustic component generated magnetic field strength is to be reduced, then the protective construction design becomes very complex and, accordingly, to each of the above solutions 2.1-2.6 is usually added:

2.7. A small perforated plate made of a ferromagnetic material and having such a size and design as to provide a target screening efficiency.

Said component being arranged between the speaker and a filter having a very fine porosity or, alternatively, between two porosity filters.

The first three solutions do not provide protection against liquid materials, and have only a small efficiency against intermediate-large size solid articles (see the above 2.2. and 2.3. items).

On the contrary, the above 2.4. to 2.6. solutions provide a good protection even against a possible intrusion of contaminating liquids and powder into the acoustic component.

Each of the above standard solutions, in combination with 2.7., is adapted to combine a required protection against liquid and solid materials, depending on the target solution efficiency, with a magnetic field screening.

An overlapping of multiple layers of a protecting/screening material tends to worsen the component acoustic performance, since they represent additional obstacles to a normal air flow.

An optimum solution would be that of designing protecting/screening means having a low acoustic impedance and, if possible, providing a trade-off between the required protecting/screening level and the related acoustic impedance.

In the most common cases, such as in cellular phones, the screens are assembled together with synthetic foamed material gaskets and bi-adhesive strip templates, to provide a strong adhesion of the screen to the apparatus outer body.

It should be apparent that, if multiple layers are provided for protecting/screening acoustic components, then the additional elements to be assembled (gaskets/adhesive tapes) and their assembling steps and the resulting overall thickness will greatly increase depending on the protecting/screening layer number.

FIG. 2 shows some examples of the above components, made of a monofilament polyester (2.5.) technical fabric material, and further including an annular gasket with an adhesive area to be glued on a cellular phone shell.

From an acoustic standpoint, such an optional protective screen must not change the inlet or outlet sound flow in comparison with a designed target one.

Usually, for a large number of consumer acoustic products, it is necessary to reduce to a minimum the sound pressure level attenuation.

Accordingly, the protective screen should be "acoustically transparent or clear" and provide its protecting function with an interference as small as possible with the acoustic component inlet or outlet sound flow.

This is very common in a cellular phone protecting screen, which should not excessively attenuate the speaker sound or microphone sensitivity, thereby allowing to use small, light and inexpensive acoustic members.

On the contrary, in other cases, for example in a middle-high range acoustic product, it is desirable that the protecting screen provides a true acoustic function, to roll-off possible emission peaks, or deformed sounds, to in turn differently balance or compensate for the acoustic component frequency response.

In any case, the textile material component, either of a woven fabric or a non-woven or membrane type, should have the designed acoustic features which may range, depending on the application, from a maximum "acoustic transparency" to a given sound attenuating level.

To quantify the above acoustical characteristics, different evaluating methods can be used.

The Standard Test Method for Airflow Resistance of Acoustical Materials (ASTM C522-87) correlates the air flow-rate and the load loss in a case of a stationary air flow passing through the textile product. The results are given in Rayls MKS, and low values of this parameter correspond to "acoustically transparent" materials.

The "acoustic impedance" value is based on the same parameters as above, but it is measured in an air flow alternating regimen, that is under conditions closely corresponding to the acoustic application environment.

Finally, if it is possible to directly test the acoustic screen in a final configuration thereof (that is with its final shape and size identical to that installed in a commercial end-product) then a direct measurement of the sound pressure level may be carried out, either with or without a textile screen arranged between the sound source and the measurement microphone.

The result is usually provided in decibels, dB(SPL), and is referred to different forming methods (ISO/FDIS 7235: 2003 or the like).

The International Standard 1 EC60529 rule defines the Ingress Protection index with reference to some testing conditions, which may be more or less stringent, in which the electronic component shell is subjected to an intrusion of solid articles or water.

The first digit of the IP index is related to the solid material intrusion resistance.

Levels from IP1X to IP4X are usually of small interest for acoustic components, which, on the other hand, nearly always require the IP5X level, assuring a partial protection against a powder intrusion.

The requirement of an IP6X level, related to perfectly sealed or tightness components, on the contrary, is not common.

The second digit of the IP index refers to the water resistance, the IPX3, IPX4 and IPX5 levels showing a different amount of water spray resistance.

Usually, for the most common articles, such as cellular phones, the IPX3 level would be sufficient.

On the contrary, the "heavy duty" acoustic product market requires a protective level up to IPX8, corresponding to a water immersion resistance up to a depth of 10 meters for a time period up to 24 hours, which are very stringent conditions for the intended applications.

As stated, for a number of hand-held systems it is necessary to reduce the magnetic field/magnetic induction intensity at a given distance from the magnetic field source (that is the acoustic component) to prevent interferences with electronic components nearby, such as, for example, antennas, and to reduce the attraction exerted by said acoustic component on metal particles negatively affecting its operation.

Because of a designing trend to continuously reduce the electronic device thickness and size, the above magnetic field screening requirement will be very important to enhance the acoustic component protecting level and to reduce electromagnetic interferences with components arranged nearby.

To assess the screening efficiency of an acoustic component "protecting" means, no reference rule is known and, usually, this is achieved by:
- directly testing the screen in its final configuration and verifying the absence of electromagnetic interferences with other components, if no magnetic field/magnetic induction maximum threshold value exists (at a set distance from the magnetic field source);
- directly testing the screen in its final configuration and performing a magnetic induction value measurement at the outer opening, by arranging the magnetic field detecting probe in contact with the device casing;
- verifying that the magnetic field/magnetic induction value is lower than the target threshold value;
- measuring the magnetic field/magnetic induction value, either with or without the screen, in those same geometric conditions, to calculate the screening efficiency of the medium used.

As above disclosed, at present different technical solutions are used, based on different textile products (non-woven, synthetic monofilament woven technical materials, water-repellent membranes), providing the acoustic and protecting performance required by modern acoustic products.

With respect to the acoustic, mechanical strength, processing and geometric coherency features, in case of a protecting requirement against particles of >15 μm size, and a IPX4 class water-repellent standard, the subject synthetic single-thread or monofilament technical fabrics provide the most suitable solution.

If said fabrics must also have a magnetic field screening capability, then are conventionally used small perforated plate elements of a ferromagnetic material (such as, for example, Mumetal, Permalloy, Metglas, Nanoperm, ferritic materials, ferromagnetic alloy steels or high relative magnetic permeability materials) arranged between the speaker and protective fabric, which plate elements are made by shearing sheet metal elements, which are further perforated by cold punching or chip removing operations.

It should be pointed out that, independently from the perforating method, no perforated ferromagnetic material rolls are at present available on the market, but only plate or sheet elements of a set size, which, in this prior art, are not coupled to other roll form media.

In fact, a coupling of plates having a set size would not be advantageous compared with a coupling of a roll form material.

The punched sheet metal family comprises those sheet metal elements which are perforated by perforating molds, including a punch and die assembly, mounted on punching or perforating press machines.

Thus, through the above punching, it is possible to provide several hole types fitted to different application requirements in any industrial fields. A drawback of the above perforating type is a hole diameter/sheet metal thickness ratio which, for a stainless steel (the most inexpensive material among those having a high magnetic permeability), cannot be less than 1.

The minimum thickness of steel plates perforated by a punching perforating method is typically of 0.3 mm.

Thus, considering the typical hole pitch values, from commercially available products having a thickness of 0.3 mm and a hole diameter of 0.3 mm, ferromagnetic steel perforated plates with a 1.84-2.13 $kg/dm^3$ weight and a free surface from 10% to 22% are provided.

A number of applications do not require the above large amount of ferromagnetic material to provide the required screening efficiency, and the free surface thereof is a comparatively small one, which negatively affects the acoustic impedance.

To reduce the hole diameters (for a set plate thickness), plates perforated by multi-mandrel perforating heads are used, thereby it is possible to make holes of a size lower than the sheet metal element thickness while combining high empty/full rates with small passage cross-sections.

In such a case, the machining costs are much more higher, thereby this method is not suitable for small thickness (few tens of mm) plates and the product thus made is still a plate.

The prior art shows the drawbacks related to a use of the above perforated small plates:
- a high cost of said perforated plates, due to the material perforating/shearing processes;
- a difficult coupling of fabric rolls to perforated material rolls (plates);
- a complex assembling of multiple protective layers on the acoustical component (for example the technical fabric plus a perforated plate or vice versa);
- a need of increasing the number of components required for the assembling (gasket/adhesive tape) based on the number of protective layers used;
- an increasing of the overall thickness because of an overlapping of two protective layers, plus the individual components required for assembling purposes, as schematically shown in FIG. 4;
- an increasing of the device weight; and
- an increasing of the acoustic impedance.

The subject monofilament technical fabric material is per se very strong, tenacious, of even thickness, and it may be cut by the most common cutting methods in this field.

However, even if, from an acoustic standpoint, the square mesh synthetic fabric has very good acoustic properties, it still does not provide an efficient magnetic screening.

Document US 2010/304796 A1 discloses substantially the preamble of the main claim.

More specifically, document US 2010/304796 A1 discloses an electronic circuit carrier having at least a first and a second side, said sides facing away from each other, said circuit carrier comprising: a speaker placed on a first side arranged with a first magnetic shielding plate, and a second magnetic shielding plate arranged adjacent said second side. At least one of the magnetic shielding plates comprises one or more openings allowing passage of the sound produced by said loudspeaker. The magnetic shielding plates are made of a metal or of a metal alloy.

Document EP 0 609 223 B1 discloses an electromagnetic interference shielding filter comprising a porous composite material, allowing passage of gases, especially air, and comprising interconnected pores and voids that form passageways extending through the thickness and opening on both sides of said material, said material having electromagnetic radiation shielding properties comprising a layer of porous electrically conductive material (2), adhered to a layer of a porous material (15) coated with an amorphous copolymer of tetrafluoroethylene and perfluoro-2,2-dimethyl-1,3-dioxole.

Document US 2013/032285 A1 discloses a laminar textile construction to be used in acoustic components, wherein said construction comprises a double layer arrangement made by coupling a technical synthetic single-thread fabric material to a polymeric film, for use as sub-components in acoustic and electric products in general.

SUMMARY OF THE INVENTION

The aim of the present invention is to provide such a multi-layer textile construction for protecting and screening from magnetic fields, adapted to overcome the above mentioned prior art drawbacks.

This is achieved by a substantial improvement of the subject monofilament fabric material which is a truly novel material providing an acoustic and protecting performance not provided by conventional prior fabrics.

The above and other objects, which will become more apparent hereinafter, are achieved by a multi-layer textile construction for magnetic field protecting and screening applications according to claim 1.

The use of a technical fabric made of a ferromagnetic alloy, such as AISI 430, allows to achieve magnetic field screening properties, in addition to protecting properties against particles and liquids provided by the synthetic fabric.

In fact, a material having a high magnetic permeability allows, by the so-called "shunt effect", to restrain the magnetic field lines (even of a stationary or low frequency <1 MHz magnetic field) inside said material, while reducing the strength of said magnetic field and its outside environment magnetic induction.

The screening efficiency depends on the screen size and thickness, which, in case of a porous medium such as the fabric, may be easily expressed in the term of a material mass, and the magnetic permeability.

Since metal fabrics, such as ferromagnetic steel fabrics, are available on the market in a roll form, the coupling with the synthetic monofilament fabric is very simple and advantageous, since it can be made by continuous coupling methods.

Moreover, the cost of the metal fabric (for example made of an AISI 430 material) is lower than that of a perforated plate, the free surface area rate being the same.

Furthermore, it is possible to make (the forming alloy material being the same) metal fabrics lighter than the perforated plates and with a larger free surface, useful for those applications in which a small ferromagnetic material mass is sufficient to achieve the desired screening efficiency.

In addition, the possibility of enhancing the free surface rate in comparison with a perforated plate, further improves the overall acoustic performance, thereby allowing to produce a single multilayer product (a synthetic monofilament fabric plus a ferromagnetic monofilament fabric) in which are integrated protecting properties against solid particles and liquids, acoustic properties and magnetic field screening properties.

This greatly simplifies the assembling of the product (which, with respect to these operating steps, is typically made manually or by expensive automatic handling devices).

In fact, it is not necessary to assemble a plurality of protective material layers on the acoustic component (for example a fabric and perforated plate assembly) but this may be achieved by a single product already made in a multi-layer form providing all the required functional properties.

This not only means a simplified assembling of the product, but also a reduction of the costs related to the components for assembling and fixing the individual layers of protective materials (adhesive tapes, gaskets) and a reduction of the overall thickness.

From an acoustic standpoint, the performance is at least equivalent to or better than that provided by conventional solutions.

In this connection it should be pointed out that a use of the sole metal fabric would not allow to meet all the protection requirements of the component, which, on the contrary, are met by an addition of the synthetic fabric.

In fact, to provide a target suitable screening efficiency, it is necessary to use a very heavy metal fabric (for example AISI 430 with a mass of 1 kg/m$^2$, which does not simultaneously meet the protecting requirements against particles smaller than 100 microns).

In comparison with the solution including a fabric plus a perforated plate of a ferromagnetic material, to be assembled inside the device, the present invention provides the following advantages:

an integration of all the required properties in a single product (protection against solid particles and liquids, calibrated acoustic properties, screening from stationary/low frequency magnetic fields);
a simplifying of the supply chain;
a simplifying of the product assembling;
a reduction of the costs related to the use of adhesive tapes or strips and gaskets for assembling and clamping the individual components;
a reduction of the overall thickness related to the reduction of the adhesive tapes and gaskets required for assembling and clamping or fixing the individual components;
a possibility of reducing the product weight;
a possibility of increasing the free surface rate with a consequent improvement of the acoustic properties;
a reduction of the costs, which are much lower than using a perforated plate.

Thus, to sum up, the novel product according to the present invention provides a true and remarkable improvement to the prior art protecting screens included in acoustic members of a number of consumer audio and electronic devices.

BRIEF DESCRIPTION OF THE DRAWINGS

Further characteristics and advantages of the present invention will become more apparent hereinafter from the following disclosure of a preferred, though not exclusive, embodiment of the invention, which is illustrated, by way of an indicative but not limitative example, in the accompanying drawings, where.

DESCRIPTION OF THE PREFERRED EMBODIMENTS

Figure 1:
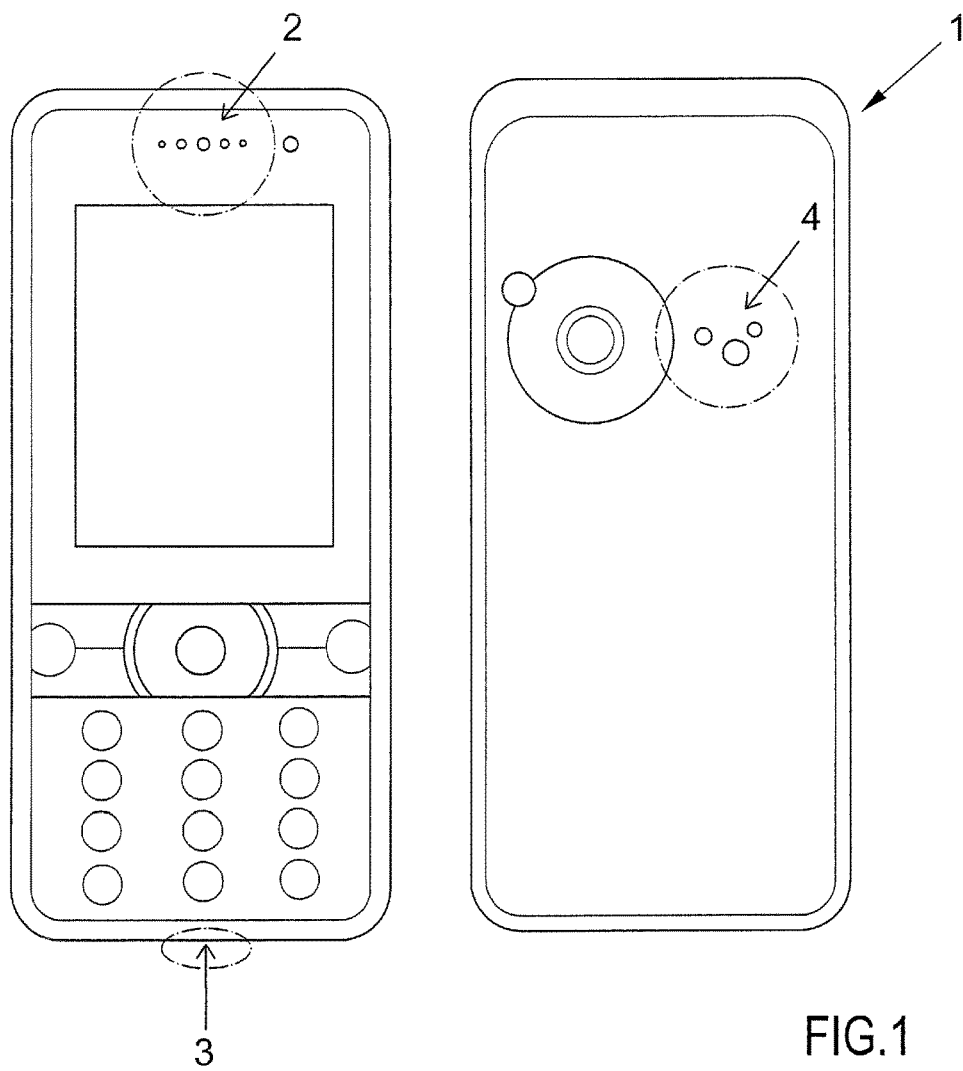
FIG. 1 shows a typical cellular phone.
Figure 2:
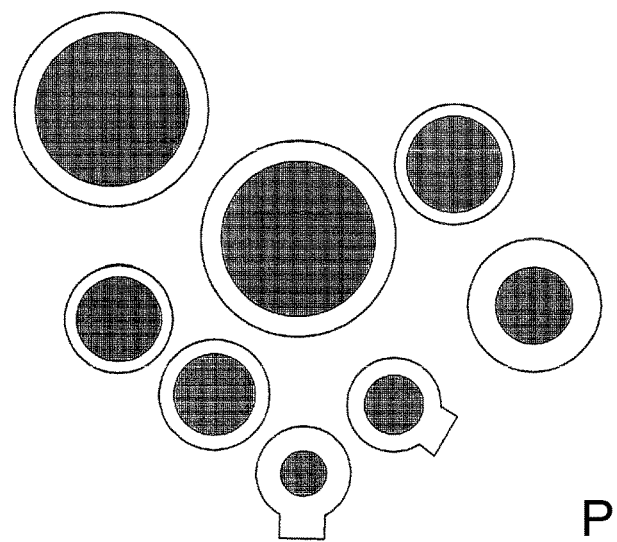
FIG. 2 shows some exemplary embodiments of protecting/screening components made of a polyester monofilament technical fabric and including an annular gasket with an adhesive area for gluing on a cellular phone shell.
Figure 3:
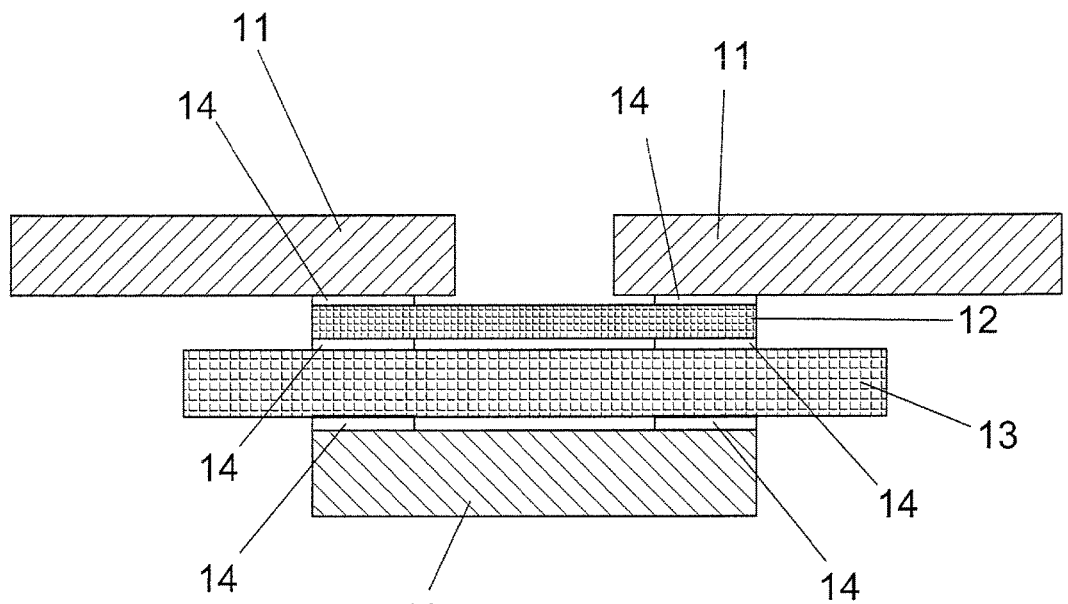
FIG. 3 is a cross-sectional view schematically showing an exemplary embodiment of a "stack-up" of the protective layers near the acoustic component, according to the prior art.

More specifically, FIG. 3 shows a typical example of a stack-up of a plurality of protecting or protective layers, near an acoustic component 10, according to the prior art, wherein, between the acoustic component 10 (which is a magnetic field source) and the device casing 11 (which is a plastic material box), the protecting monofilament fabric 12 (for providing protection against solid particles and liquids) and a ferromagnetic material perforated plate 13 are arranged.

From bottom to top, from the acoustic component 10 to the device casing 11, the layers are typically assembled to one another by a bi-adhesive material and gaskets 14.

Alternatively, the ferromagnetic material perforated plate 13 may be fixed by a small support frame made of a plastics or a metal material.

Figure 4:
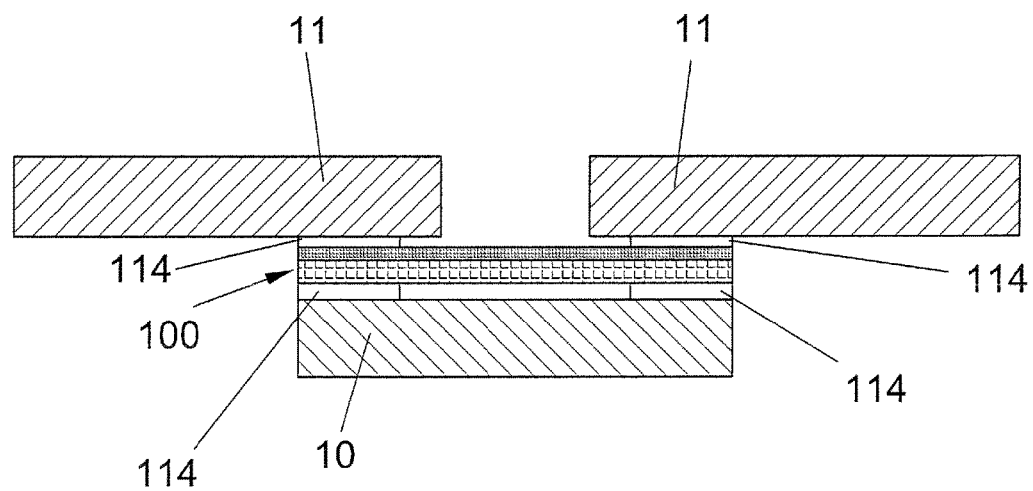
FIG. 4 is a cross-sectional view schematically showing an exemplary embodiment of a stuck-up of the protective layers near the acoustic component, according to the present invention.

According to the present invention, the exemplary embodiment of a stack-up shown in FIG. 4 comprises, between the magnetic field source, that is the acoustic component 10, and the casing 11 of the device product, only a multi-layer element 100, which is assembled by a bi-adhesive material and/or a gasket 114.

Hereinbelow will be illustrated a preferred embodiment which, together with the results obtained, is just an exemplary embodiment of the subject product or device, and is not intended as limitative of the invention, neither with respect to all the industrial solutions to make it, nor with respect to all the different alternative embodiments related to the materials constituting said product.

By way of an example are moreover shown some types of the inventive product made by the above disclosed methods.

The top layer comprises a square mesh technical fabric made of a ferromagnetic alloy steel material (for example AISI 430).

The parameters of said top layer are included in the following exemplary parameter ranges: a thread diameter from 70 to 350 microns, a thread/cm number from 4 to 70 (inventive products have been already made having a thread diameter in a 100-220 microns range, with a thread/cm number in a 7-45 range).

The bottom layer is constituted by a square mesh technical fabric made of a polyester (PET) monofilament optionally black coloured.

The construction has constructional parameters in the following exemplary parameter ranges: a thread diameter from 19 to 260 microns; a thread/cm number from 10 to 300 (inventive products have been already made having a thread diameter in a 27-31 range, with a thread/cm number in a 120-190 range).

The coupling of the two surfaces is made by a hot melt laminating, with an addition of a molten PUR (reactive polyurethane) material applied according to a spot or line coupling pattern including suitably spaced spots or lines.

The novel and inventive material, being a textile product, may be supplied in the form of rolls of different roll heights (for example from 80 to 220 cm) or it may be processed to provide strips or webs having a smaller width (even of only 15 mm), or it may be die-cut according to any desired die-cut pattern.

Figure 5:
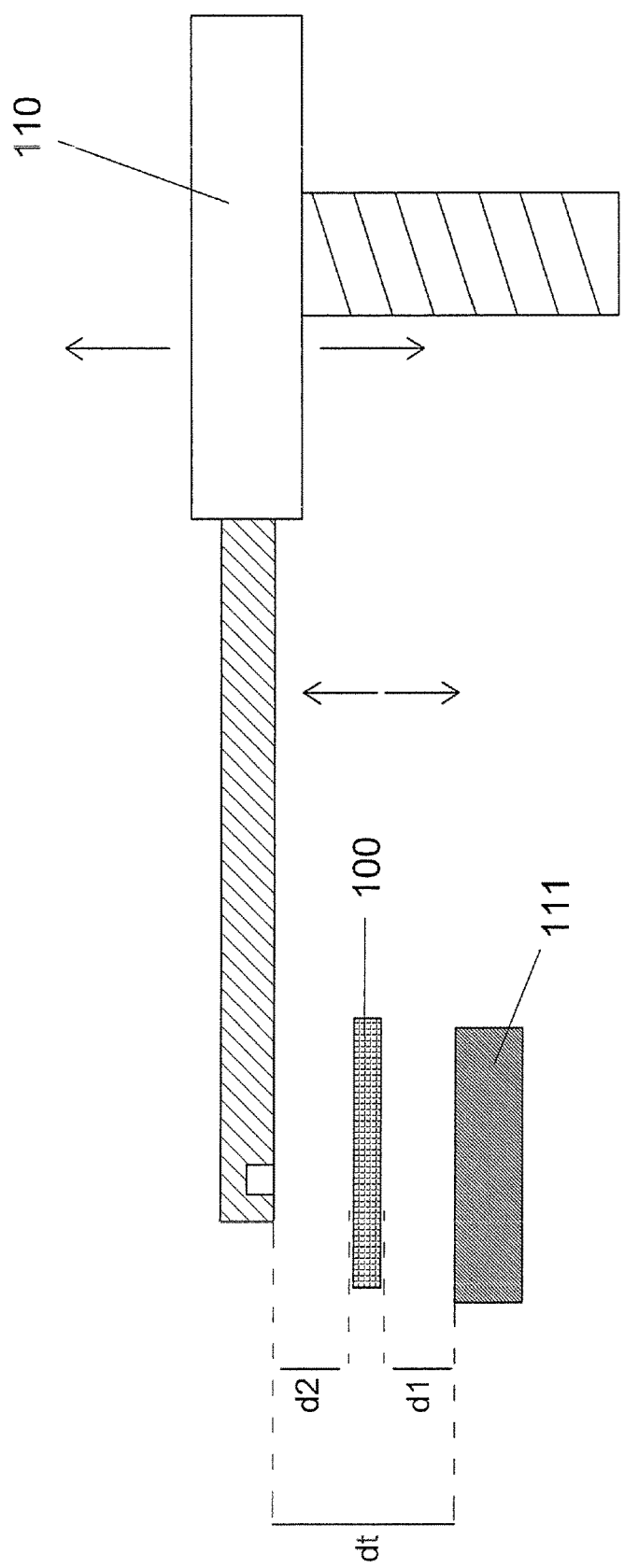
FIG. 5 schematically shows the configuration used in a test for testing the screening efficiency of the laminated product or material, according to the present invention.

FIG. 5 shows an exemplary layout for performing a screening efficiency test on the laminated material 100, according to the present invention, for example for testing the achieved screening efficiency.

The test is carried out by using a measurement probe 110 and a loudspeaker 111, where dt=d1+d2+thickness of the laminated material 100.

The following Table shows the results achieved by a laminated product made of a synthetic monofilament technical fabric having a thread/cm number of 180, with a thread diameter of 27 microns; a ferromagnetic steel monofilament fabric with a thread/cm number of 17 and a thread diameter of 175 microns.

| | Magnetic Induction B(mT) Measured at dt = 3 mm | |
|---|---|---|
| d1 (mm) | without any screen | with a laminated screen |
| 0 | 37.2 | 30.7 |
| 0.5 | 37.2 | 27.6 |
| 1 | 37.2 | 24.6 |
| 2 | 37.2 | 20.2 |

It has been found that the invention fully achieves the intended aim and objects.

In fact, a double-layer laminated construction has been provided, made by coupling a ferromagnetic alloy metal thread technical fabric with a synthetic monofilament technical fabric, which has been specifically designed for protecting acoustic products and electronic products in general.

The inventive construction can be made by adding either one or more further layers with optional additional functions, for example aesthetical and waterproofing functions, and so on.

The construction can also be made with a screening function for screening from magnetic fields and protective functions against solid particles and liquids and being moreover air permeable.

The present construction may also have an acoustic and screening function against magnetic fields and/or a protective function, and it is specifically designed to be mounted inside finished acoustic products.

In the most common exemplary case, without any limitation, the products are contoured or shaped products constituted by said construction coupled to gaskets and bi-adhesive films, die-cut according to the pattern or design of the finished acoustic product.

The present invention relates moreover to complete functional sub-assemblies such as, for example, speaker and microphone sub-assemblies, containing the inventive construction and joined to further optional sub-components such as supports, acoustic channels or chambers, which are usually molded from a plastic material or made by any other making methods, and optionally including the acoustic member itself (speaker or microphone).

The construction according to the present invention may also be used for making further components to be installed inside the acoustic and/or electronic products.

The present construction may also comprise a synthetic monofilament or multiple-filament technical fabric including PET, PA6, PA6.6, PP, PEN, PBT, PE, PEEK, PPS, PI of different constructions, and having variable thread/cm numbers, thread diameters, weaving and finishing layouts.

The present construction may also comprise a technical fabric of a ferromagnetic material (having a relative magnetic permeability >1), such as, for example, Mumetal, Permalloy, Metglas, Nanoperm, ferritic materials, ferromagnetic alloy steel materials (for example AISI 430, 403), nickel or any other high relative magnetic permeability materials.

The subject construction may be made in several weaving and geometric cal layouts and its starting textile materials may be finished and/or surface processed as desired, for example by dyeing for cosmetic purposes, or providing water-repellent and metallization treatments, and so on.

Moreover, it is possible to use any other existing polymer adapted to be processed in a single-thread or multiple-thread form, suitable for being woven in a weaving process.

Moreover, it is possible to use any other existing ferromagnetic material adapted to be processed in a single-thread or multiple-thread form, suitable for being woven in a weaving process.

The present construction may also be made by coupling and/or laminating processes, preferably by a hot-melt laminating process with an addition of a PUR (reactive polyurethane) material, as a coupling material for coupling the two construction layers.

It is also possible to make the subject construction by alternative coupling methods such as a hot laminating method with an addition of a low melting point mat material, an application of pressure sensible adhesives and in general any other method providing a continuous coupling of two or more textile product layers, including possible future developments deriving from technological improvements.

In practicing the invention, the used materials, as well as the contingent size and shapes may be any, depending on requirements.

The invention claimed is:
1. A textile multi-layer construction for protecting and screening from stationary or low frequency magnetic fields generated by acoustic components, in particular loudspeaker and microphones, said textile multi-layer construction being a single multilayer product and comprising: an open, square or rectangular mesh technical fabric top layer made of a metal ferromagnetic alloy monofilament thread; and a square mesh synthetic monofilament technical fabric bottom layer, said mesh technical fabric top layer made of a metal ferromagnetic alloy monofilament thread being coupled by lamination to said synthetic monofilament technical fabric bottom layer to form said textile multi-layer construction as said single multilayer product, said technical fabric top layer made of a metal ferromagnetic alloy monofilament thread having a thread diameter from 70 microns to 350 microns and a thread/cm number from 4 to 70, said synthetic monofilament technical fabric bottom layer being a square mesh polyester monofilament technical fabric, having a thread diameter from 19 microns to 260 microns and a thread/cm number from 10 to 300, whereby said textile multi-layer construction is air permeable and provides, in addition to said magnetic field screening function, also a protecting function against solid particles and liquids.

2. A textile multi-layer construction according to claim 1, wherein said top and bottom fabric layers are coupled by a laminating method providing a diffused joining of said two fabric layers.

3. A textile multi-layer construction according to claim 1, wherein said technical fabric top layer comprises a ferromagnetic alloy AISI 430.

4. A textile multi-layer construction according to claim 1, wherein said textile construction comprises further textile construction layers having additional functions, comprising one or more; aesthetic and waterproofing additional functions.

5. A textile multi-layer construction according to claim 1, wherein said textile construction comprises gaskets and a bi-adhesive film for coupling said textile construction to an acoustical product.

6. A textile multi-layer construction according to claim 1, wherein said technical fabric bottom layer is selected from PET, PA6, PA6.6, PP, PEN, PBT, PE, PEEK, PPS, or PI.

7. A textile multi-layer construction according to claim 1, wherein said technical fabric top layer is selected from Mumetal, Permalloy, Metglas, Nanoperm, ferritic materials, ferromagnetic alloy steels, or nickel.

8. A textile multi-layer construction according to claim 1, wherein said textile construction comprises starting textile materials surface finished/processed comprising one or more; by dyeing for cosmetic purposes, water-repellent processes, metalizing and antistatic processes.

9. A textile multi-layer construction according to claim 1, wherein said bottom and top fabric layers are coupled by hot-melt laminating with an addition of a PUR (reactive polyurethane) material as a joining material for joining said two layers, and being applied according to a spaced line or spot layout.

10. A textile multi-layer construction according to claim 1, wherein said bottom and top fabric layers are coupled by hot laminating with an addition of a low melting point mat material and a pressure sensitive adhesive.

11. A finished functional sub-assembly comprising one or more of a speaker and microphone sub-assembly, comprising a textile construction according to claim 1, and coupled to other sub-components comprising one or more of supports, acoustical channels or chambers.

12. A textile multi-layer construction according to claim 1, wherein said single multilayer product is in a form of a roll.

* * * * *